(12) United States Patent
King et al.

(10) Patent No.: US 6,740,545 B2
(45) Date of Patent: *May 25, 2004

(54) ADHESION ENHANCED SEMICONDUCTOR DIE FOR MOLD COMPOUND PACKAGING

(75) Inventors: Jerrold L. King, Boise, ID (US); J. Mike Brooks, Caldwell, ID (US); Walter L. Moden, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/309,643

(22) Filed: Dec. 3, 2002

(65) Prior Publication Data

US 2003/0082849 A1 May 1, 2003

Related U.S. Application Data

(63) Continuation of application No. 09/873,581, filed on Jun. 4, 2001, now Pat. No. 6,489,186, which is a continuation of application No. 09/394,180, filed on Sep. 10, 1999, now Pat. No. 6,316,292, which is a continuation of application No. 08/963,395, filed on Nov. 3, 1997, now Pat. No. 6,066,514, which is a division of application No. 08/731,793, filed on Oct. 18, 1996, now Pat. No. 5,760,468, which is a continuation of application No. 08/306,024, filed on Sep. 14, 1994, now Pat. No. 5,583,372.

(51) Int. Cl.⁷ .......................... H01L 21/44; H01L 21/48; H01L 21/50
(52) U.S. Cl. ................. 438/118; 438/127; 438/928
(58) Field of Search ................. 438/118, 127, 438/928

(56) References Cited

U.S. PATENT DOCUMENTS

| | | |
|---|---|---|
| 3,686,539 A | 8/1972 | Schwartzman |
| 3,902,148 A | 8/1975 | Drees et al. |
| 4,024,570 A | 5/1977 | Hartmann et al. |
| 4,348,253 A | 9/1982 | Subbarao |
| 4,546,374 A | 10/1985 | Olsen |
| 4,631,805 A | 12/1986 | Olsen |
| 4,702,941 A | 10/1987 | Mitchell et al. |
| 5,215,801 A | 6/1993 | Wong |
| 5,227,661 A | 7/1993 | Heinen |
| 5,302,553 A | 4/1994 | Abbott |
| 5,313,102 A | 5/1994 | Lim et al. |
| 5,360,991 A | 11/1994 | Abys et al. |
| 5,402,006 A | 3/1995 | O'Donley |
| 5,449,951 A | 9/1995 | Parthasarathi et al. |
| 5,576,577 A | 11/1996 | Takenouchi et al. |
| 5,583,372 A | 12/1996 | King et al. |
| 5,723,369 A | 3/1998 | Barber |

FOREIGN PATENT DOCUMENTS

| | | | | |
|---|---|---|---|---|
| JP | 359063750 | * | 4/1984 | ........... H01L/23/48 |
| JP | 0099362 | | 3/1992 | |
| JP | 0162551 | | 6/1992 | |

\* cited by examiner

*Primary Examiner*—Jack Chen
*Assistant Examiner*—Nema Berezny
(74) *Attorney, Agent, or Firm*—TraskBritt

(57) ABSTRACT

A semiconductor die includes a metal layer deposited thereon for enhancing adhesion between the die and a mold compound package. The metal layer is substantially oxide free. The die is coated with a layer or layers of copper (Cu) and/or palladium (Pd) by electroplating or electroless coating techniques. The metal layer provides a uniform wetting surface for better adhesion of the die with the mold compound packaging during encapsulation. The increased adhesion reduces the delamination potential of the die from the package.

20 Claims, 1 Drawing Sheet

ADHESION ENHANCED SEMICONDUCTOR DIE FOR MOLD COMPOUND PACKAGING

CROSS-REFERENCE TO RELATED APPLICATIONS

This application is a continuation of application Ser. No. 09/873,581, filed Jun. 4, 2001, now U.S. Pat. No. 6,489,186, issued Dec. 3, 2002, which is a continuation of application Ser. No. 09/394,180, filed Sep. 10, 1999, now U.S. Pat. No. 6,316,292, issued Nov. 13, 2001, which is a continuation of application Ser. No. 08/963,395, filed Nov. 3, 1997, now U.S. Pat. No. 6,066,514, issued May 23, 2000, which is a divisional of application Ser. No. 08/731,793, filed Oct. 18, 1996, now U.S. Pat. No. 5,760,468, issued Jun. 2, 1998, which is a continuation of application Ser. No. 08/306,024, filed Sep. 14, 1994, now U.S. Pat. No. 5,583,372, issued Dec. 10, 1996.

BACKGROUND OF THE INVENTION

1. Field of the Invention

This invention relates in general to a semiconductor die packaging technique and, more particularly, to a die having a metal layer back side for enhanced adhesion of the die in a Leads On Chip (LOC) package system.

2. State of the Art

A semiconductor integrated circuit (IC) packaged device generally includes an IC chip (die) being connected to inner leads of a lead frame by wire bonds. The chip, wire bonds, and inner leads are completely encapsulated (packaged) for protection with a substance, such as plastic. Outer leads communicate with the inner leads of the lead frame, but the outer leads typically remain exposed for mounting of the packaged device to external circuitry, such as a printed circuit board. Conventionally, encapsulation occurs by a transfer molding technique wherein the encapsulation substance is a thermoset epoxy molded around and to the die and lead frame and subsequently cured.

In a conventional IC packaged device, a semiconductor die is placed on and bonded to a center die paddle of a lead frame for support. Inner lead fingers of the lead frame approach the paddle but do not contact or communicate with the paddle. Rather, wire bonds communicate between contact pads on the die and the inner lead fingers of the lead frame by spanning the gap between the die and the fingers. The wire bonds allow for the transmission of the electrical signals to and from the die and the lead frame.

However, to shrink the conventional packaging requirements, techniques such as the Lead On Chip (LOC) method have been developed. The LOC technique disposes the inner lead fingers of a lead frame directly over the die (or IC chip) rather than away from the die. Double-sided adhesive insulating tape attaches the conductive lead fingers to the die so that no gap exists between the die and lead fingers. Wire bonds communicate between the contact pads on the die and the inner lead fingers which are disposed over the insulating tape directly over a portion of the die adjacent the die pads.

This LOC technique allows the entire packaging of the IC device to be smaller because the inner lead fingers are disposed directly over the die rather than separate from the die. Similar to the LOC technique, other variations of using an adhesive tape for adhering lead fingers and, consequently, shrinking packaging requirements include a Tape Under Frame technique and a Leads Under Die method.

Although IC packaging is minimized in each of these packaging techniques that uses an adhesive tape, other problems surface. One such problem in the LOC technique is the difficulty of obtaining a good, solid adhesive bond between the die and the package. One reason a solid bond is not achieved is because the oxide on the silicon die substrate does not lend itself to uniform wetting, which is necessary for good adhesion with the liquid mold compound.

When a die does not bond well with the mold compound package, delamination may occur and the device may potentially be ruined during the manufacturing process or surface mount of the package. Since production environment areas retain a substantial humidity level to reduce static buildup, i.e., often about 50%, moisture absorbs into the mold compound and can penetrate delaminated areas between the die and mold compound. When the moisture is converted to steam from heat processes and the steam pressure is greater than the strength of the adhesion couple between the mold compound and the die, the mold compound will crack or explode with a "popcorn" effect.

To overcome this potential package cracking problem, one technique has been to bake the moisture out of the mold compound to ensure a low moisture content within the package. Another step is to place the device in a "dry package" for shipping purposes by placing the final semiconductor chip product in a shipping container with a desiccant drying agent, such as silica gel. Although these techniques are commonly used in the semiconductor industry, they provide only a temporary solution. Namely, when a semiconductor manufacturer ships a "dried" packaged device by following these techniques, the device may still absorb moisture at a customer's site after the device is removed from the shipping container materials. Furthermore, if the die has delaminated even slightly, the package is subject to moisture penetration again and the package may subsequently crack if exposed to sufficient heat.

Another technique for reducing delamination potential is disclosed in U.S. Pat. No. 5,227,661 issued to Heinen on Jul. 13, 1993. Although this method provides a working solution, it retains disadvantages by its use of aminopropyltriethoxsilane as a coating on the die.

Obviously, the foregoing problems and solutions associated with providing a good bond between a die and a die package to avoid delamination and cracking of the package are undesirable aspects of conventional semiconductor packaging techniques. Accordingly, objects of the present invention are to provide an improved bonding between a semiconductor die and its encapsulating package in order to decrease delamination potential of the die from the package.

BRIEF SUMMARY OF THE INVENTION

According to principles of the present invention in its preferred embodiment, a back side of a semiconductor die includes a metal layer deposited thereon for enhancing adhesion between the die and a mold compound package. The metal layer is substantially oxide free. The die is coated with a layer or layers of copper (Cu) and/or palladium (Pd) by electroplating or electroless coating techniques.

According to further principles of the present invention, the metal layer preferably comprises approximately 50 micro inches of a Cu layer deposited over the back side of the die and approximately 2 to 3 micro inches of a Pd layer deposited over the Cu layer.

Advantageously, the metal layer on the die provides a uniform wetting surface for better adhesion of the die with the mold compound during encapsulation. The increased adhesion reduces delamination potential of the die from the package and, consequently, reduces cracking of the package.

The aforementioned principles of the present invention provide an adhesion enhanced semiconductor die for improving adhesion of the die with a mold compound packaging. Other objects, advantages, and capabilities of the present invention will become more apparent as the description proceeds.

DETAILED DESCRIPTION OF THE INVENTION

Figures 1, 2:
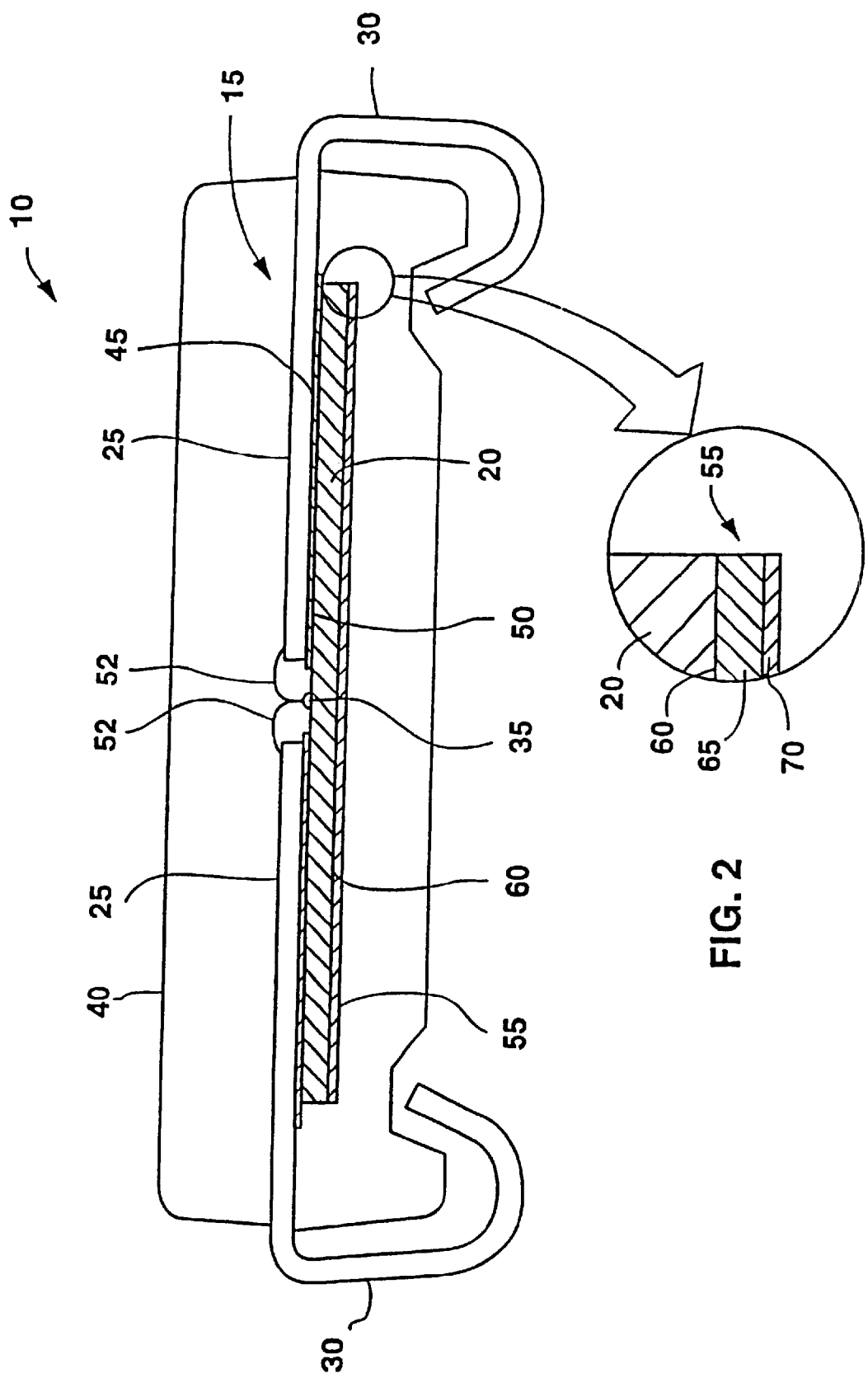
FIG. 1 is an end-section view of a packaged integrated circuit die having the present invention adhesion enhanced layer deposited thereon.
FIG. 2 is an enlarged partial view of FIG. 1.

FIG. 1 is an end-section view of packaged integrated circuit (IC) 10. Lead frame 15 is disposed over IC die 20, the lead frame including inner and outer lead finger portions 25 and 30, respectively. Inner lead finger portions 25 are adjacent die pads 35, and outer lead finger portions 30 extend outward of mold compound packaging 40 for connection with appropriate external circuitry.

Insulator adhesive tape strips 45 are disposed between inner lead finger portions 25 and frontside 50 of die 20 to adhere the lead finger portions to the die. Integrated circuitry is disposed on frontside 50 of die 20. Wire bonds 52 communicate between inner lead finger portions 25 and die pads 35 for making the electrical connection between the die and the lead finger portions.

Metal layer 55 is shown deposited over back side 60 of die 20. Metal layer 55 enhances adhesion of die 20 with mold compound packaging 40. Metal layer 55 is deposited over die 20 using an electroplating process or electroless coating process well known in the art prior to packaging the die with mold compound packaging 40.

Metal layer 55 provides a uniform wetting surface for mold compound packaging 40 to adhere better to die 20. Although shown in its hardened and cured state, mold compound packaging 40 is in a flowing state when it is initially heated over and molded around die 20. Consequently, the uniform wetting surface provided by metal layer 55 enhances the adhesion between the die and the mold compound packaging.

In its preferred embodiment, metal layer 55 is substantially oxide free. Also, preferably, the metal layer is either palladium (Pd) or copper (Cu), or a combination thereof, although it is obvious other metals may likewise suffice. Although copper is cheaper in cost, it retains more oxide which counteracts the intended adhesion. Palladium is more expensive, but provides a substantially oxide-free layer for effectuating a good bond with the mold compound.

Although a single metal layer suffices to provide the advantages of the present invention, in its preferred embodiment, metal layer 55 actually comprises a plurality of layers as shown in FIG. 2. Namely, a cheaper, thicker layer 65 of copper deposited over back side 60 of die 20 provides a good barrier to the oxide on die 20. A thinner layer 70 of palladium is deposited over the copper layer 65 to provide an even more uniform wetting surface. The palladium is also substantially free from oxide. Preferably, about 50 micro inches of copper and approximately 2 to 3 micro inches of palladium are deposited. Consequently, this combination of metal layers provides the enhanced adhesion metal layer 55 on die 20 and, together, provides a good balance of cost and effectiveness.

As previously mentioned, when a die does not bond well with the mold compound package, delamination may occur and the device may potentially be ruined during the manufacturing process or surface mount of the package because of moisture penetration between the die and compound. When the moisture is converted to steam from heat processes and the steam pressure is greater than the strength of the adhesion couple between the mold compound packaging the die, the mold compound packaging will crack or explode with a "popcorn" effect.

The present invention, as described and diagramed, reduces this potential package cracking problem. Consequently, no baking of the moisture out of the mold compound packaging is needed, and no "dry packaging" the device for shipping purposes is needed.

What has been described above are the preferred embodiments for a semiconductor die having a metal layer back side for enhancing adhesion between the die and its mold compound packaging. It is clear that the present invention provides a powerful tool for reducing delamination potential of a die and subsequent cracking of the mold compound packaging. While the present invention has been described by reference to specific embodiments, it will be apparent that other alternative embodiments and methods of implementation or modification may be employed without departing from the true spirit and scope of the invention.

What is claimed is:

1. A semiconductor device encapsulation method, comprising:

disposing at least one substantially oxide-free metal on at least a portion of a back surface of a die so as to contact at least said portion; and applying mold compound to at least a portion of said at least one substantially oxide-free metal, said at least one substantially oxide-free metal enhancing adhesion of said mold compound to at least said portion.

2. The method of claim 1, wherein said disposing comprises electroplating.

3. The method of claim 1, wherein said disposing comprises electroless coating.

4. The method of claim 1, wherein said disposing comprises disposing a plurality of materials on at least said portion, an outermost material of which comprises a substantially oxide-free metal.

5. The method of claim 4, wherein said disposing comprises:

disposing copper directly on at least said portion; and disposing palladium over said copper.

6. The method of claim 1, wherein said disposing comprises disposing at least one of copper and palladium on at least said portion.

7. The method of claim 1, wherein said disposing comprises disposing said at least one substantially oxide-free metal over an entirety of said back surface of said die.

8. The method of claim 7, wherein said applying is effected over said at least a portion of said back surface bearing said at least one substantially oxide-free metal.

9. A semiconductor device encapsulation method, comprising:

disposing at least one substantially oxide-free metal in contact with at least a portion of a back surface of a die; and covering at least said portion of said back surface of said die with a mold compound, said mold compound being wettable with respect to said at least one substantially oxide-free metal.

10. The method of claim 9, wherein said disposing comprises electroplating.

11. The method of claim 9, wherein said disposing comprises electroless coating.

12. The method of claim 9, wherein said disposing comprises disposing a plurality of materials, an outermost of which comprises said at least one substantially oxide-free metal.

13. The method of claim 9, wherein said disposing includes:

disposing copper in contact with at least said portion of said back surface of said die; and disposing palladium over said copper.

14. The method of claim 9, wherein said at least one substantially oxide-free metal comprises at least one of palladium and copper.

15. A method for enhancing adhesion of a mold compound to a semiconductor die, comprising:

disposing a first metal in contact with at least a portion of a back surface of a semiconductor die;

disposing a substantially oxide-free metal over said first metal, said substantially oxide-free metal providing a wetting surface to enhance adhesion of a mold compound to at least said portion of said back surface; and adhering said mold compound to at least said substantially oxide-free metal.

16. The method of claim 15, wherein at least one of said disposing said first metal and said disposing said substantially oxide-free metal comprises electroplating.

17. The method of claim 15, wherein at least one of said disposing said first metal and said disposing said substantially oxide-free metal comprises electroless coating.

18. The method of claim 15, wherein said disposing said first metal comprises disposing a substantially oxide-free metal.

19. The method of claim 18, wherein said disposing said first metal comprises disposing copper.

20. The method of claim 15, wherein said disposing said substantially oxide-free metal comprises disposing palladium.

* * * * *

UNITED STATES PATENT AND TRADEMARK OFFICE
CERTIFICATE OF CORRECTION

PATENT NO. : 6,740,545 B2  Page 1 of 1
DATED : May 25, 2004
INVENTOR(S) : Jerrold L. King, J. Mike Brooks and Walter L. Moden It is certified that error appears in the above-identified patent and that said Letters Patent is hereby corrected as shown below:

Column 1,
Line 52, change "the die." to -- the die, and the lead frame does not include a die paddle for supporting the die. --.

Column 3,
Line 13, change "FIG. 1." to -- FIG. 1, showing a corner edge of the die and an adhesion-enhanced layer. --.
Line 19, change "frame including" to -- frame 15 including --.
Line 45, change "packaging." to -- packaging 40. --.
Line 66, change "and, together, provides" to -- and provides --.

Column 4,
Line 8, delete "couple" and after "packaging" at the end of the line, insert -- and --.
Line 11, change "as described and diagramed," to -- as shown and described, --.

Signed and Sealed this

Twenty-eighth Day of March, 2006

JON W. DUDAS
*Director of the United States Patent and Trademark Office*